(12) United States Patent
Kohno

(10) Patent No.: US 8,859,964 B2
(45) Date of Patent: Oct. 14, 2014

(54) ELECTRON MICROSCOPE AND METHOD OF ADJUSTING THE SAME

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 13/915,725

(22) Filed: Jun. 12, 2013

(65) Prior Publication Data

US 2013/0327938 A1    Dec. 12, 2013

(30) Foreign Application Priority Data

Jun. 12, 2012    (JP) ................................ 2012-132930

(51) Int. Cl.
```
G01R 31/305    (2006.01)
H01J 37/28     (2006.01)
H01J 37/244    (2006.01)
H01J 37/22     (2006.01)
```

(52) U.S. Cl.
CPC ......... *H01J 37/22* (2013.01); *H01J 2237/2826* (2013.01); *H01J 2237/0209* (2013.01); *H01J 2237/06341* (2013.01); *H01J 2237/24514* (2013.01); *H01J 2237/0206* (2013.01); *H01J 37/28* (2013.01); *H01J 37/244* (2013.01); *H01J 2237/24528* (2013.01); *H01J 2237/2801* (2013.01)

USPC ............ 250/307; 250/306; 250/309; 250/311

(58) Field of Classification Search
None
See application file for complete search history.

(56) References Cited

U.S. PATENT DOCUMENTS

| | | | | |
|---|---|---|---|---|
| 5,210,487 A | * | 5/1993 | Takahashi et al. | 324/754.22 |
| 5,416,426 A | * | 5/1995 | Okubo et al. | 324/754.22 |

FOREIGN PATENT DOCUMENTS

| | | | | |
|---|---|---|---|---|
| JP | 05307942 A | * | 11/1993 | .............. H01J 37/22 |
| JP | 5307942 A | | 11/1993 | |

* cited by examiner

*Primary Examiner* — Andrew Smyth
(74) *Attorney, Agent, or Firm* — The Webb Law Firm

(57) ABSTRACT

An electron microscope is offered which has a detector and a noise canceling circuit whose offset can be easily adjusted if any information about the offset of the detector is not available. Also, a method of adjusting this microscope is offered. The method of adjusting the electron microscope (1) starts with measuring the output voltage from a preamplifier (20) at given timing while blocking the electron beam transmitted through a sample (14) from hitting the detector (15) (step S140). An offset voltage to be set into the noise canceling circuit (30) is calculated based on the measured output voltage from the preamplifier (20) (step S150). The calculated offset voltage is set into the noise canceling circuit (30) (step S160).

3 Claims, 7 Drawing Sheets

ELECTRON MICROSCOPE AND METHOD OF ADJUSTING THE SAME

BACKGROUND OF THE INVENTION

1. Field of the Invention

The present invention relates to an electron microscope and method of adjusting it.

2. Description of Related Art

Generally, electrons released from a field-emission electron gun contain a fluctuation portion representing several percent of the total amount, because gas is adsorbed onto the emitter surface and adsorbed gas and ions migrate, varying the work function of the metal surface and because ion bombardment varies the metal surface morphology. Therefore, where a field-emission electron gun is used in a scanning electron microscope, emission noise on the image is removed by placing a detector for noise cancellation in the electron optical column, detecting near electrons forming a probe to thereby form an electron detection signal, and dividing a signal released from the sample by the electron detection signal. Such an electron microscope is disclosed, for example, in JP-A-5-307942.

FIG. 7 shows the configuration of a scanning transmission electron microscope (STEM), 100, having a general noise canceling function. This microscope 100 is configured including an electron beam source 111, a noise canceling aperture 112, a lens 113, a detector 115, a preamplifier 120, a noise canceling circuit 130, and a processing section (CPU) 140. The electron beam released from the electron beam source 111 is partially cut off by the noise canceling aperture 112 and then converged onto a sample 114 by the lens 113. The beam transmitted through the sample 114 is partially detected by the detector 115. The output signal from the detector 115 is amplified by the preamplifier 120 and then the emission noise component of the signal is removed by the noise canceling circuit 130. The processing section 140 converts the analog output signal from the noise canceling circuit 130 into digital form, averages or otherwise processes the output signal, creates image data, and sends the data to a personal computer (PC) 200. The computer 200 receives the image data, creates an image of the sample 114, displays the image on a display unit, and stores or otherwise processes the image. If the current $i_P$ (t) hitting the sample 114 and the output $i_A$ (t) from the noise canceling aperture 112 are in a proportional relationship, and if the offset component added by the preamplifier 120 is correctly subtracted by the first stage of the noise canceling circuit 130, then contrast produced by the emission noise in an STEM image can be reduced. If the subtraction of the offset component is not correct, then it follows that the difference (constant) divided by $I_A$ (t) is added to the detection signal (output signal), thus increasing the noise in the STEM image. The offset component (G×O) set into the noise canceling circuit 130 has been calculated in an analog or digital manner from the offset signal (O) set into the preamplifier 120.

In this way, in the past, the amount of offset set into the noise canceling circuit has been computed based on information about a signal set into a detector. Where an external detector is used, a sufficient amount of information about the offset of the detector may not be obtained. This makes it difficult to perform the noise canceling function effectively. Furthermore, the output signals from the detector and preamplifier are varied due to the effects of temperature variations. This varies the amount of offset to be set into the noise canceling circuit.

SUMMARY OF THE INVENTION

In view of the foregoing problems, the present invention has been made. According to some aspects of the present invention, it is possible to offer an electron microscope in which an offset adjustment for noise cancellation can be carried out easily if information about the offset of a detector is not available. Also, a method of adjusting this microscope is offered.

(1) A method of adjusting an electron microscope in accordance with the present invention is implemented for the electron microscope having an electron beam source for producing an electron beam, an electron beam detecting portion for detecting a part of the electron beam, an image detecting portion for detecting a signal obtained in response to impingement of the electron beam on a sample, and a noise canceling portion for subtracting an offset signal from an output signal from the image detecting portion and dividing the resulting difference by an output signal from the electron beam detecting portion. This method starts with measuring the output signal from the image detecting portion at given timing while blocking the signal obtained in response to impingement of the electron beam on the sample from entering the image detecting portion. The offset signal is calculated based on the measured output signal from the image detecting portion. The calculated offset signal is set into the noise canceling portion.

The signal obtained in response to the impingement of the electron beam on the sample may be a signal, for example, based on an electron beam transmitted through the sample or a signal based on electrons released from the sample when an electron beam hits it.

One method of blocking the signal obtained in response to the impingement of the electron beam on the sample from entering the image detecting portion consists of mounting a shutter (blocking portion) between the sample and the image detecting portion to block the signal from entering the image detecting portion. Another method consists of mounting a shutter (blocking portion) between the electron beam source and the sample to block the electron beam from hitting the sample, thus blocking the signal from entering the image detecting portion.

According to the electron microscope adjusting method associated with the present invention, the output signal from the image detecting portion is measured while blocking the signal obtained in response to the impingement of the electron beam on the sample from entering the image detecting portion. Consequently, offset information about the image detecting portion can be obtained. According to the electron microscope adjusting method associated with the present invention, an offset signal to be set into the noise canceling portion is calculated based on the offset information about the image detecting portion and set into the noise canceling portion. Therefore, if any information about the offset of the detector is not available, an offset adjustment for noise cancellation can be carried out easily.

According to the electron microscope adjusting method of this embodiment, offset information about the image detecting portion including the effects of temperature drift can be obtained by measuring the output signal from the image detecting portion while blocking a signal obtained in response to impingement of an electron beam on the sample from entering the image detecting portion. The offset signal set into the noise canceling portion can be maintained optimally by repeating this measurement.

(2) Another electron microscope adjusting method associated with the present invention is based on the method (1)

above and further characterized in that the given timing may be synchronized with the operation for obtaining an image based on the output signal from the image detecting portion.

The given timing may precede acquisition of an image of the sample or follow acquisition of an image of the sample (such as during a flyback time).

According to the electron microscope adjusting method associated with the present invention, an offset adjustment for noise cancellation can be automatically carried out synchronously with the timing at which an image of a sample is obtained. This dispenses with user's manual operations. Furthermore, the offset adjustment for noise cancellation is repeatedly perfomed synchronously with the timing at which an Bilge of a sample is obtained. Consequently, the offset signal set into the noise canceling portion can be maintained optimally.

(3) An electron microscope associated with the present invention has an electron beam source for producing an electron beam, an electron beam detecting portion for detecting a part of the electron beam, an image detecting portion for detecting a signal produced in response to impingement of the electron beam on a sample, a noise canceling portion for subtracting an offset signal from an output signal from the image detecting portion and dividing the resulting difference signal by an output signal from the electron beam detecting portion, and a processing section operative to measure the output signal from the image detecting portion at given timing while blocking the signal produced in response to impingement of the electron beam on the sample from entering the image detecting portion, to calculate the offset signal based on the measured output signal, and to set the calculated offset signal into the noise canceling portion.

According to the electron microscope associated with the present invention, offset information about the image detecting portion can be obtained by measuring the output signal from the image detecting portion while blocking the signal obtained in response to impingement of the electron beam on the sample from entering the image detecting portion. According to the electron microscope associated with the invention, an offset signal to be set into the noise canceling portion can be calculated and set into the noise canceling portion based on the offset information about the image detecting portion. Therefore, if any information about the offset of the detector is not available, an offset adjustment for noise cancellation can be carried out easily.

Furthermore, according to the electron microscope of this embodiment, offset information about the image detecting portion which includes the effects of temperature drift can be obtained by measuring the output signal from the image detecting portion while blocking the signal obtained in response to impingement of the electron beam on the sample from entering the image detecting portion. Consequently, the offset signal that is set into the noise canceling portion can be maintained optimally by repeating the measurement.

DESCRIPTION OF THE INVENTION

The preferred embodiments of the present invention are hereinafter described in detail with reference to the drawings. It is to be understood that the embodiments described below do not unduly restrict the contents of the present invention delineated by the claims and that not all the configurations described below are essential constituent components of the invention.

In the following, a scanning transmission electron microscope (STEM) is taken as one example of electron microscope associated with the present invention. The present invention can also be applied to other electron microscopes such as a scanning electron microscope (SEM).

1. First Embodiment

Figure 1:
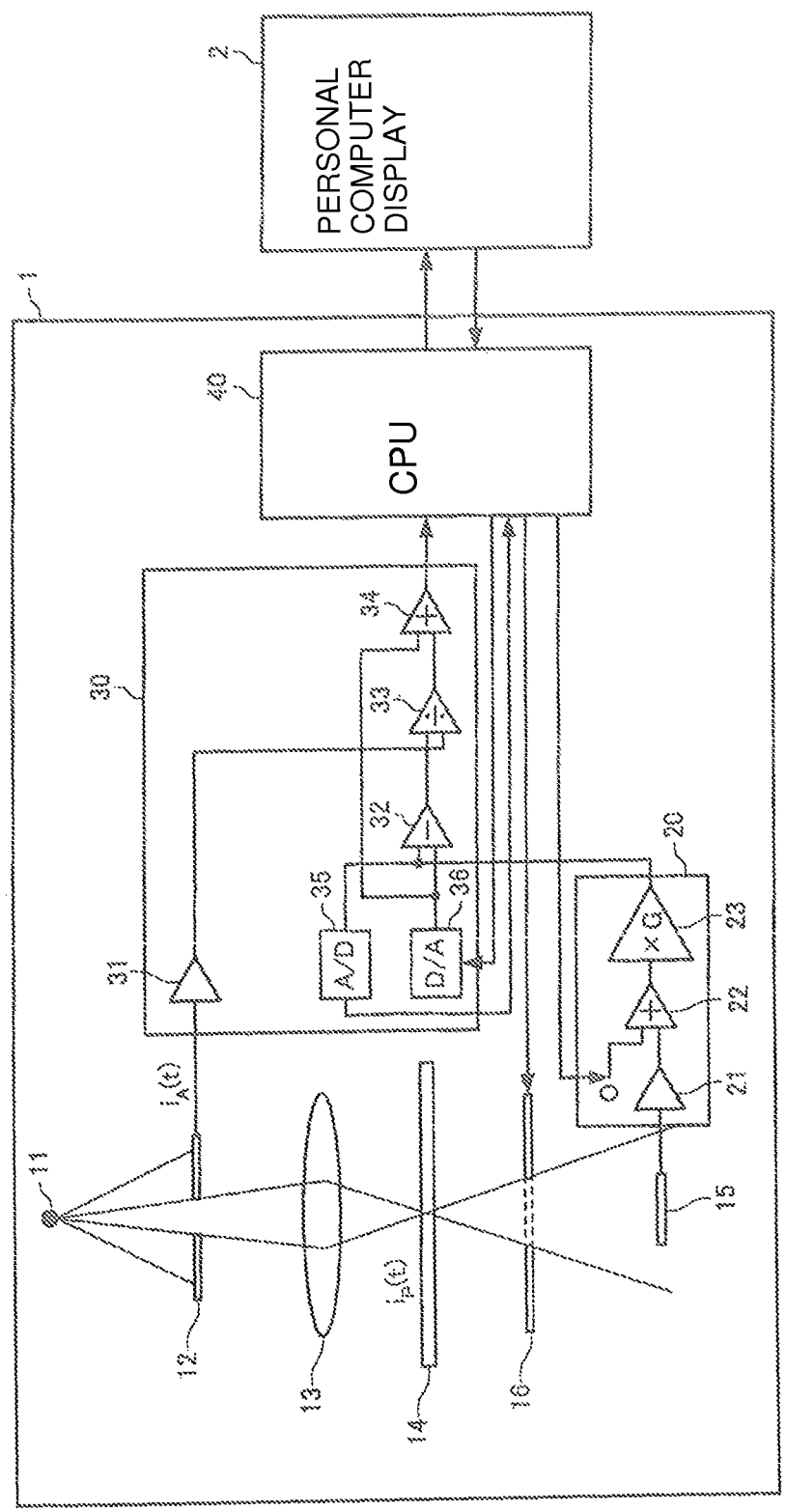
FIG. 1 is a block diagram showing an example of configuration of an electron microscope according to a first embodiment of the present invention.

FIG. 1 shows one example of configuration of an electron microscope according to a first embodiment of the present invention. This microscope is generally indicated by reference numeral 1 and configured including an electron beam source 11, a noise canceling aperture 12, a lens 13, a detector 15, a shutter (beam blanker) 16, a preamplifier 20, a noise canceling circuit 30, and a processing section (CPU) 40. The electron microscope 1 is a scanning transmission electron microscope (STEM). Other types of lenses and apertures (not shown) are mounted in the microscope. Some of the constituent elements of the electron microscope 1 of the present embodiment shown in FIG. 1 may be omitted, some modifications may be made to the constituent elements, or other constituent elements may be added. The electron beam source 11, noise canceling aperture 12, lens 13, and detector 15 are housed in an electron optical column (not shown). The preamplifier 20 can also be housed in the electron optical column.

The electron beam released from the electron beam source 11 is partially cut off by the noise canceling aperture 12 and then converged onto a sample 14 by the lens 13. A well-known electron gun such as a CFEG (cold-field emission gun) can be used as the electron beam source 11.

The shutter 16 is mounted between the sample 14 and the detector 15. When the shutter 16 is closed, the electron beam transmitted through the sample 14 does not impinge on the detector 15. On the other hand, when the shutter 16 is open, the beam transmitted through the sample 14 passes through the shutter 16 and becomes partially detected by the detector 15. An image signal detected by the detector 15 is in proportion to the product of the brightness component $s(t)$ of the sample 14 and the probe current $i_P(t)$ hitting the sample 14, i.e., $s(t) \times i_P(t)$.

In the present embodiment, the preamplifier 20 is configured including an I/V converter 21, an adder 22, and an amplifier 23. The output signal, $s(t) \times i_P(t)$, from the detector 15 is converted into a voltage by the I/V converter 21. An offset O set by the processing section 40 is added to this voltage by the adder 22. The resulting sum is amplified by a factor of G by the amplifier 23. Therefore, the output signal $V_1$ from the amplifier 23 (output signal from the preamplifier 20) is given by $$V_1 = G \times ((s(t) \times i_P(t) + O) \quad (1)$$

The noise canceling aperture 12 detects the emission current (noise signal). For example, any illumination aperture disposed between the electron beam source 11 and the sample 14 such as a condenser aperture may also be used as the noise canceling aperture 12. Apart from the illumination aperture, a dedicated noise canceling aperture 12 may also be mounted.

Utilizing the fact that the probe current $i_P$ (t) hitting the sample 14 and the current $i_A$ (t) detected by the noise canceling aperture 12 are in a roughly proportional relationship ($i_A$ (t)≅C×$i_P$ (t)), the noise canceling circuit 30 removes (or correctly, reduces) the noise signal superimposed on the output signal from the preamplifier 20.

In the present embodiment, the noise canceling circuit 30 is configured including an I/V converter 31, a subtractor 32, a divider circuit 33, an adder 34, an A/D converter 35, and a D/A converter 36. The I/V converter 31 converts the emission current $i_A$ (t) detected by the noise canceling aperture 12 into a voltage. The subtractor 32 subtracts the output signal from the D/A converter 36 from the output signal $V_1$ from the preamplifier 20 in order to subtract an amount of offset, G x O, added by the preamplifier 20. O is already known since it is determined by a set value. If G is unknown, the amount of offset to be subtracted by the subtractor 32 is not known. Furthermore, the amount of offset to be subtracted by the subtractor 32 varies because the offset amount of the detector 15 is affected by temperature variations.

Accordingly, in the present embodiment, the A/D converter 35 for converting the analog output signal from the preamplifier 20 into digital form is mounted. When a user performs a manipulation, e.g., a GUI button displayed on the display unit of the PC 2 is depressed, the processing section 40 can measure the output voltage from the preamplifier 20 while the shutter 16 is closed. An existing shutter of the detection system mounted to adjust the exposure time may also be used as the shutter 16. Apart from the existing shutter, a dedicated shutter 16 may also be mounted.

The output voltage from the preamplifier 20 is equal to the amount of offset (amount of offset to be subtracted by the subtractor 32) G x O added by the preamplifier 20 when the shutter 16 is closed and so the processing section 40 calculates an input digital value from the output value from the A/D converter 35, the input digital value being used by the D/A converter 36 to output a voltage equivalent to the offset amount GxO. The processing section 40 sets the calculated digital value into the D/A converter 36.

Accordingly, after the noise canceling circuit 30 has been adjusted in offset, the output signal $V_2$ from the subtractor 32 is given by $$V_2 = G \times (s(t) \times i_P(t) + O) - G \times O \quad (2)$$
$$= G \times s(t) \times i_P(t)$$

The output signal $V_2$ from the subtractor 32 is applied to the numerator side of the divider circuit 33. The output signal from the I/V converter 31 is applied to the denominator side of the divider circuit 33.

Therefore, the output signal $V_3$ from the divider circuit 33 is given by $$V_3 = \frac{G \times s(t) \times i_P(t)}{i_A(t)} \quad (3)$$

where $i_A$ (t)≅C×$i_P$ (t). Therefore, this relation is substituted into Eq. (3). The output signal $V_3$ from the divider circuit 33 is approximated by $$V_3 \cong \frac{G \times s(t) \times i_P(t)}{C \times i_P(t)} \quad (4)$$
$$= G \times s(t) \times C'$$

The adder 34 sums up the output signal $V_3$ from the divider circuit 33 and the output voltage G×O from the D/A converter 36. Therefore, the output signal $V_4$ from the adder 34 is approximated by $$V_4 \cong G \times s(t) \times C' + G \times O \quad (5)$$
$$= G \times (s(t) \times C' + O)$$

Eq. (5) about the output signal $V_4$ from the adder 34 is similar to Eq. (1) about the output signal $V_1$ from the preamplifier 20 except that $i_P$ (t) of Eq. (1) has been replaced by C'. It follows that the emission noise has been removed (more correctly, has been reduced).

The processing section 40 converts the analog output signal from the adder 34 into digital form and then averages or otherwise processes the digital signal to create image data. The image data is sent to the PC 2. The processing section 40 can be realized, for example, by a microcomputer.

The PC 2 receives the image data created by the processing section 40, writes the data into a frame buffer, displays an image of the sample 14 in which the emission noise has been removed or reduced on the display unit, and stores or otherwise processes the data.

In the present embodiment, the electron beam source 11 corresponds to the "electron beam source" of the present invention. The noise canceling aperture 12 corresponds to the "electron beam detecting portion" of the present invention. The detector 15 and preamplifier 20 together correspond to the "image detecting portion" of the present invention. The noise canceling circuit 30 corresponds to the "noise canceling portion" of the present invention. The processing section 40 corresponds to the "processing section" of the present invention.

Figure 2:
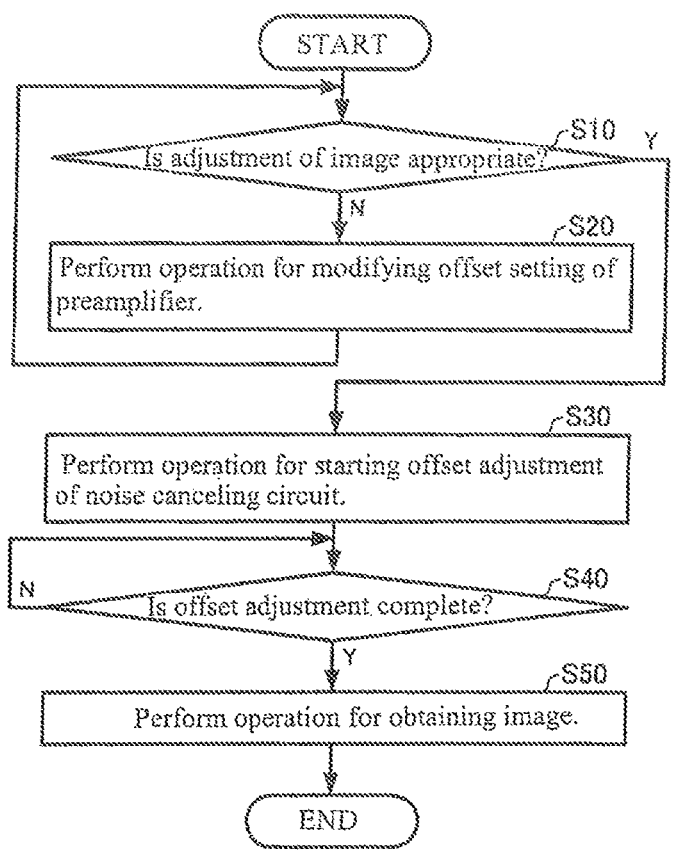
FIG. 2 is a flowchart illustrating a sequence of operations performed by a user to obtain an image of a sample in accordance with the first embodiment.
Figure 3:
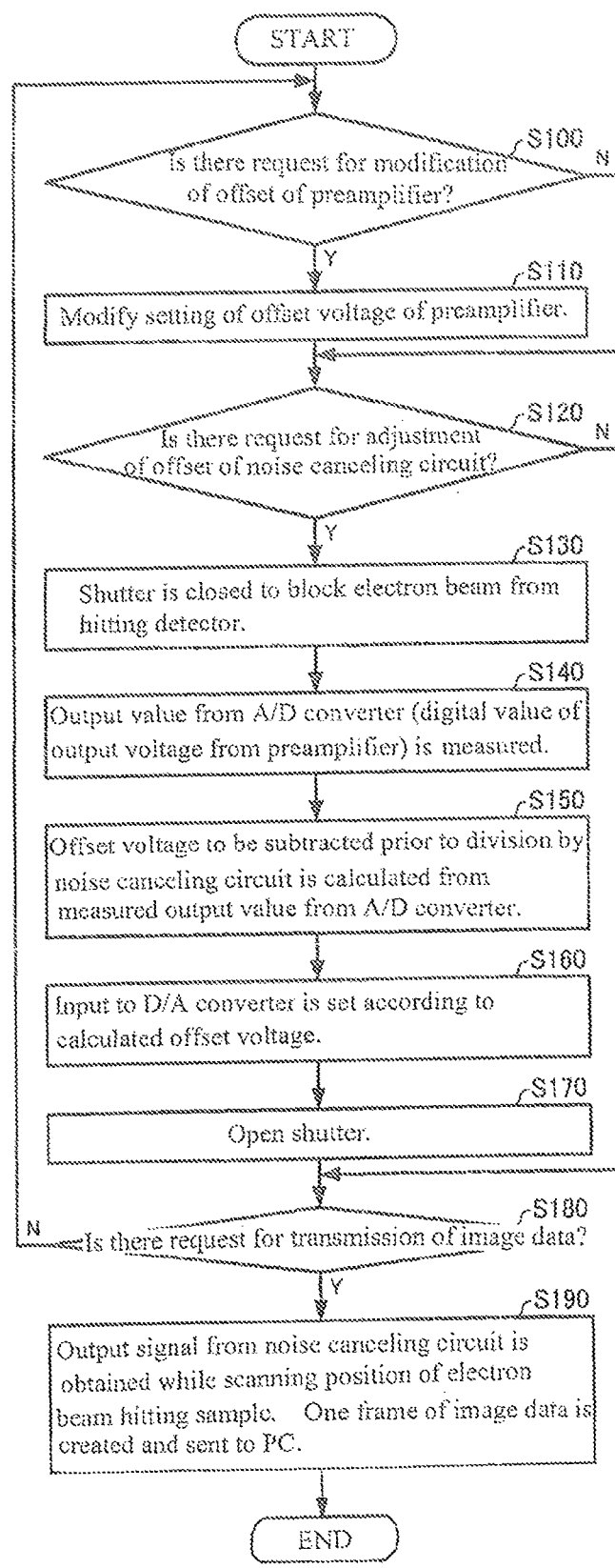
FIG. 3 is a flowchart illustrating processing performed by the processing section of the electron microscope shown in FIG. 1 to generate image data.

FIG. 2 is a flowchart illustrating a sequence of operations performed by a user to obtain an image of a sample (STEM image). FIG. 3 is a flowchart illustrating processing performed by the processing section 40 of the electron microscope 1 to generate image data.

In the present embodiment, the user first observes the image of the sample 14 displayed on the display unit of the PC 2 and makes a decision as to whether the image is adjusted appropriately in contrast and brightness (S10 of FIG. 2). If the image is adjusted appropriately (the decision at S10 of FIG. 2 is N), the user manipulates the PC 2 to modify the offset of the preamplifier 20 (S20 of FIG. 2). If this manipulation is performed, the PC 2 asks the processing section 40 of the electron microscope 1 to modify the offset of the preamplifier 20.

If there is a request for a modification of the offset of the preamplifier 20 from the PC 2 (Y at S100 of FIG. 3), the processing section 40 modifies the setting of the offset voltage of the preamplifier 20 in response to the request (S100 of FIG. 3).

The user repeats the manipulation of step S20 until the image is adjusted appropriately. If the image has been adjusted appropriately (Y at S10 FIG. 2), then, the user manipulates the PC 2 to start an offset adjustment of the noise canceling circuit 30 of the electron microscope 1 (S30 of FIG. 2). Then, the PC 2 asks the processing section 40 of the electron microscope 1 to perform an offset adjustment of the noise canceling circuit 30.

If there is a request for an offset adjustment of the noise canceling circuit 30 from the PC 2 (Y at S120 of FIG. 3), the processing section 40 performs an offset adjustment (S130 to S170 of FIG. 3) of the noise canceling circuit 30 in response to the request.

In particular, the processing section 40 first closes the shutter 16 to block the electron beam from hitting the detector 15 (S130 of FIG. 3).

The processing section 40 then measures the output value from the A/D converter 35 (digital value of the output voltage from the preamplifier 20) (S140 of FIG. 3).

The processing section 40 then calculates an offset voltage to be subtracted by the noise canceling circuit 30 prior to a division from the result of the measurement of the output value from the A/D converter 35 at S140 of FIG. 3 (S150).

The processing section 40 then sets an input to the D/A converter 36 according to the result of the calculation of the offset voltage at S150 of FIG. 3 (S160 of FIG. 3).

Finally, the processing section 40 opens the shutter 16 (S170 of FIG. 3) and terminates the offset adjustment of the noise canceling circuit 30.

Then, the user waits until the offset adjustment of the noise canceling circuit 30 is completed. If so (Y at S40 of FIG. 2), the user manipulates the PC 2 to obtain an image of the sample 14 (S50 of FIG. 2). The PC 2 asks the processing section 40 of the electron microscope 1 to send image data.

If there is a request for transmission of image data from the PC 2 (Y at S180 of FIG. 3), the processing section 40 responds to the request, obtains the output signal from the noise canceling circuit 30 while scanning the position of the electron beam hitting the sample 14, creates one frame of image data, sends the data to the PC 2 (S190 of FIG. 3), and ends the processing for creating image data.

As described so far, according to the electron microscope of the first embodiment, the offset voltages of the detector 15 and preamplifier 20 can be obtained by directly measuring the output voltage from the preamplifier 20 under the condition where the shutter 16 is closed to cut off the electron beam. An offset voltage to be set into the noise canceling circuit 30 can be computed based on information about the obtained offset voltages. Consequently, an offset adjustment of the noise canceling circuit 30 can be carried out easily if any information about the offset of the detector 15 is not available.

Furthermore, according to the electron microscope of the first embodiment, offset information including the effects of temperature drift is obtained by measuring the output voltage from the preamplifier 20 while closing the shutter 16. The offset to be set into the noise canceling circuit 30 can be maintained optimally by repeating this measurement.

2. Second Embodiment

The electron microscope of the first embodiment is so configured that an offset adjustment of the noise canceling circuit 30 is started by a user's manual operation. In contrast, in the electron microscope of the second embodiment, an offset adjustment of the noise canceling circuit 30 is automatically performed synchronously with the timing at which an STEM image is obtained.

The electron microscope of the second embodiment is similar to the electron microscope of the first embodiment except for user's manual operations to obtain images (STEM images) of a sample and also for processing performed by the processing section 40. The electron microscope of the second embodiment is identical in configuration with the microscope shown in FIG. 1 and so the configuration is omitted from being shown.

Figure 4:
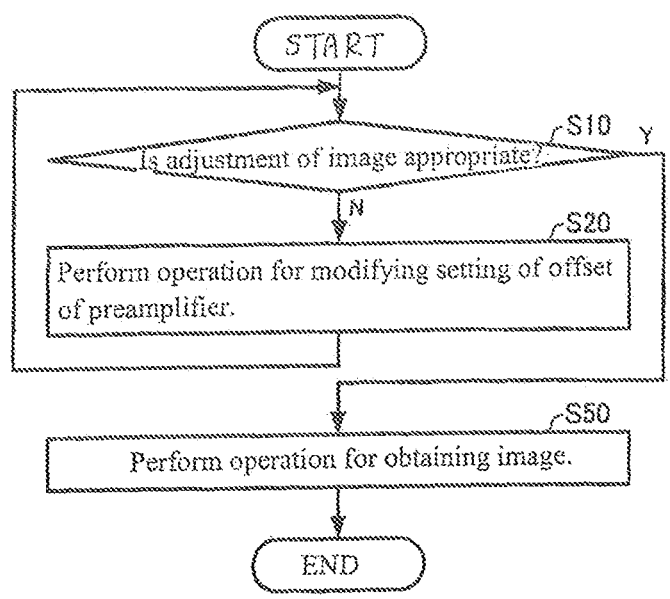
FIG. 4 is a flowchart illustrating a sequence of operations performed by a user to obtain an image of a sample in accordance with a second embodiment.
Figure 5:
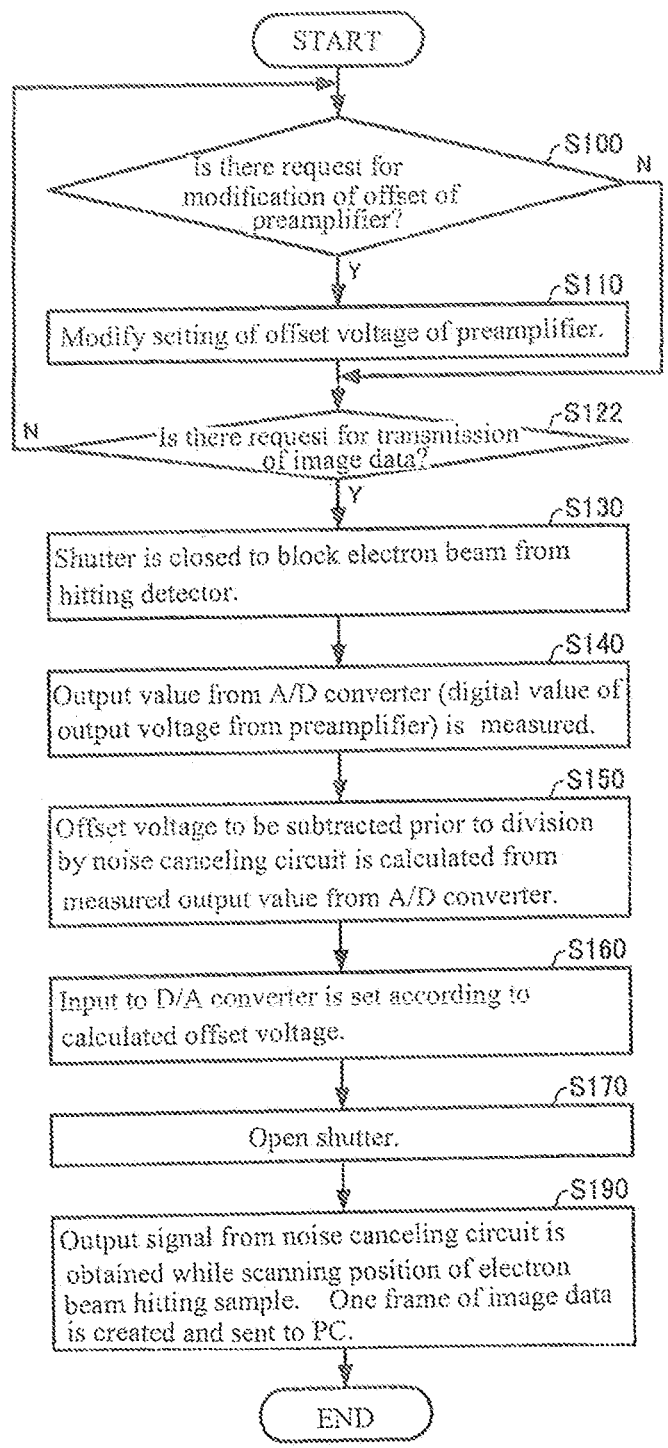
FIG. 5 is a flowchart illustrating processing performed by the processing section of the electron microscope of the second embodiment to generate image data.

FIG. 4 is a flowchart illustrating a sequence of operations performed by a user to obtain an image (STEM image) of a sample. FIG. 5 is a flowchart illustrating processing performed by the processing section 40 of the electron microscope 1 to generate image data. In FIGS. 4 and 5, steps for performing the same operation or processing as their counterparts of FIGS. 2 and 3 are indicated by the same reference numerals as in FIGS. 2 and 3.

In the present embodiment, the user first observes the image of the sample 14 displayed on the display unit of the PC 2 and makes a decision as to whether the image is adjusted appropriately in contrast and brightness (S10 of FIG. 4). If it is not adjusted appropriately (N at S10 of FIG. 4), the user manipulates the PC 2 to modify the setting of the offset of the preamplifier 20 (S20 of FIG. 4). If this manipulation is performed, the PC 2 asks the processing section 40 of the electron microscope 1 to modify the offset of the preamplifier 20.

If there is a request for a modification of the offset of the preamplifier 20 from the PC 2 (Y at S100 of FIG. 5), the processing section 40 responds to the request and modifies the setting of the offset voltage of the preamplifier 20 (S110 of FIG. 5).

The user repeats step S20 until the adjustment of the image becomes appropriate. If the adjustment becomes appropriate (Y at S10 of FIG. 4), the user manipulates the PC 2 to obtain an image of the sample 14 (S50 of FIG. 4). Then, the PC 2 asks the processing section 40 of the electron microscope 1 to send image data.

If there is a request for transmission of image data from the PC 2 (Y at S122 of FIG. 5), the processing section 40 performs steps S130-S170 of FIG. 5 for an offset adjustment of the noise canceling circuit 30. Since these steps S130-S170 of FIG. 5 for an offset adjustment are the same as the steps S130-S170 of FIG. 3 for an offset adjustment of the first embodiment, a description thereof is omitted herein.

After the end of the processing for the offset adjustment, the processing section 40 obtains an output signal from the noise canceling circuit 30 while scanning the position of the electron beam hitting the sample 14, creates one frame of image data, sends the data to the PC 2 (S190 of FIG. 5), and terminates the processing for generation of image data.

According to the electron microscope of the second embodiment described so far, the offset that is set into the noise canceling circuit 30 can be adjusted automatically before acquisition of an STEM image without affecting the STEM imaging at all by automatically measuring the amounts of offset of the detector 15 and preamplifier 20. Consequently, an offset amount optimal for the noise canceling circuit 30 can be immediately set even if the offsets of the detector 15 and preamplifier 20 vary due to the effects of temperature variations.

It is to be understood that the present invention is not restricted to the above embodiments but rather various changes and modifications are possible without departing from the gist and scope of the present invention.

Figure 6:
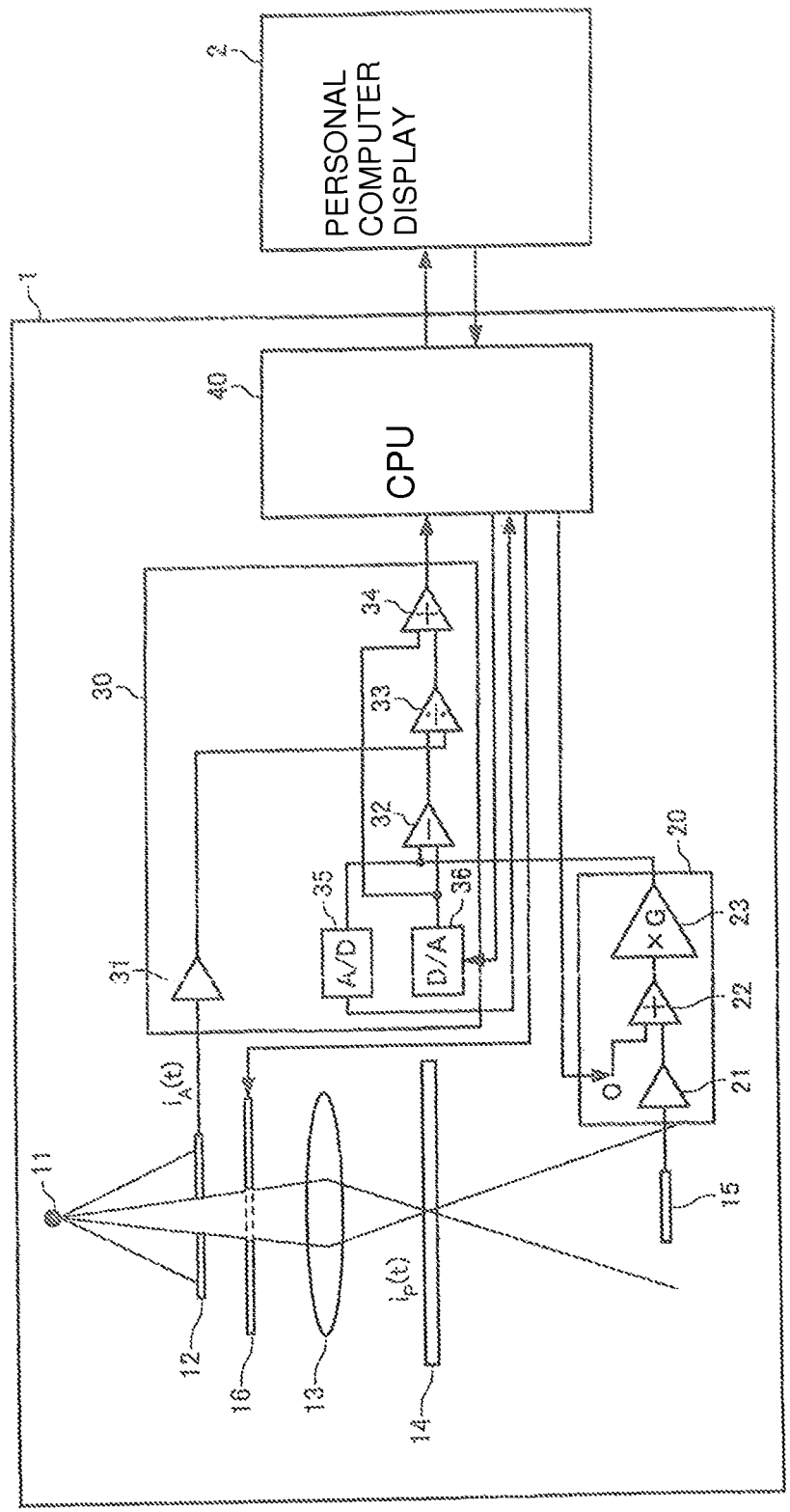
FIG. 6 is a block diagram of the configuration of an electron microscope according to a modified embodiment.
Figure 7:
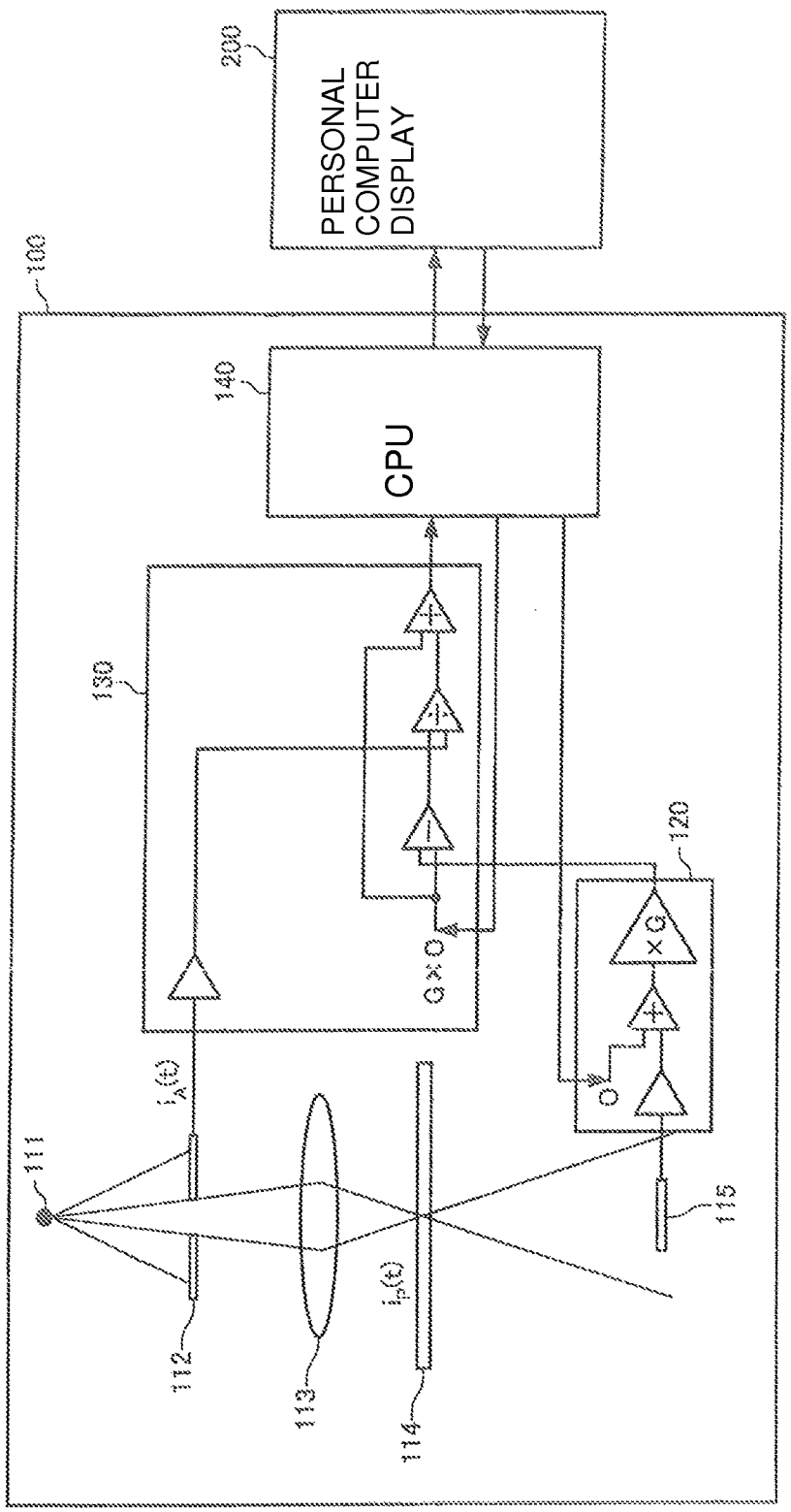
FIG. 7 is a block diagram of a scanning transmission electron microscope (STEM) having a general noise canceling function.

For example, in the first and second embodiments, the shutter 16 is mounted between the sample 14 and the detector 15. The shutter may be located anywhere between the electron beam source 11 and detector 15. For instance, as shown in FIG. 6, the shutter 16 may be located between the noise canceling aperture 12 and the lens 13. An existing shutter of the illumination system mounted for adjustment of exposure time may also be used as the shutter 16. Apart from the existing shutter, a dedicated shutter 16 may be mounted.

In the second embodiment, the offset amounts of the detector 15 and preamplifier 20 are measured automatically prior to acquisition of an STEM image. Alternatively, measurement of the offset amounts may be carried out automatically after acquisition of an STEM image. In this case, if the speed of the shutter 16 is fast, an offset adjustment of the noise canceling circuit 30 can be automatically carried out without affecting the observation of the STEM image at all during flyback time of the STEM image.

It is to be understood that the above-described embodiments and modifications are merely exemplary and that the present invention are not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. A method of adjusting an electron microscope having an electron beam source for producing an electron beam, an electron beam detecting portion for detecting a part of the electron beam, an image detecting portion for detecting a signal produced in response to impingement of the electron beam on a sample, a shutter between the electron beam source and the image detecting portion and a noise canceling portion for subtracting an offset signal from an output signal from the image detecting portion and dividing the resulting difference by an output signal from the electron beam detecting portion, said method comprising the steps of:
    (1) measuring the output signal from the image detecting portion while with the shutter temporarily blocking the signal produced in response to the impingement of the electron beam on the sample from entering the image detecting portion;
    (2) calculating said offset signal based on the measured output signal from the image detecting portion in step (1); and
    (3) setting the calculated offset signal into the noise canceling portion.

2. The method of adjusting an electron microscope as set forth in claim 1, wherein said steps (1) to (3) are performed at times when an image is not obtained in response to the output signal from said image detecting portion.

3. An electron microscope comprising:
    an electron beam source for producing an electron beam;
    an electron beam detecting portion for detecting a part of the electron beam;
    an image detecting portion for detecting a signal produced in response to impingement of the electron beam on a sample;
    a noise canceling portion for subtracting an offset signal from an output signal from the image detecting portion and dividing the resulting difference by an output signal from the electron beam detecting portion;
    a blocking portion comprising a shutter between the electron beam source and the image detecting portion to temporarily block the signal from the sample produced in response to impingement of the electron beam on the sample from entering the image detecting portion; and
    a processing section operative to measure the output signal from the image detecting portion while the blocking portion blocks the signal from the sample from entering the image detecting portion, to calculate said offset signal based on results of the measurement, and to set the calculated offset signal into said noise canceling portion.

* * * * *